United States Patent [19]
Burgoyne, Jr. et al.

[11] Patent Number: 5,874,516
[45] Date of Patent: *Feb. 23, 1999

[54] NONFUNCTIONALIZED POLY(ARYLENE ETHERS)

[75] Inventors: William Franklin Burgoyne, Jr., Allentown; Lloyd Mahlon Robeson, Mucungie, both of Pa.; Raymond Nicholas Vrtis, Carlsbad, Calif.

[73] Assignee: Air Products and Chemicals, Inc., Allentown, Pa.

[21] Appl. No.: 502,508

[22] Filed: Jul. 13, 1995

[51] Int. Cl.$^6$ .......................... B32B 27/04; B32B 27/28; C08G 65/00
[52] U.S. Cl. ............................. 528/219; 361/746
[58] Field of Search .......................... 525/390; 428/108, 428/411.1, 419, 441, 451, 446, 448, 450; 528/219, 176; 361/746

[56] References Cited

U.S. PATENT DOCUMENTS

| | | | |
|---|---|---|---|
| 3,332,900 | 7/1967 | Farnham et al. | 260/47 |
| 4,889,909 | 12/1989 | Beseck et al. | 528/125 |
| 4,990,588 | 2/1991 | Knebel et al. | 528/125 |
| 5,108,840 | 4/1992 | Mercer | 428/411.1 |
| 5,114,780 | 5/1992 | Mercer et al. | 428/195 |
| 5,145,936 | 9/1992 | Mercer | 528/86 |
| 5,155,175 | 10/1992 | Mercer et al. | 525/390 |
| 5,173,542 | 12/1992 | Lau et al. | 525/351 |
| 5,179,188 | 1/1993 | Mercer et al. | 528/219 |
| 5,204,416 | 4/1993 | Mercer et al. | 525/390 |
| 5,219,978 | 6/1993 | Hay et al. | 528/128 |
| 5,235,044 | 8/1993 | Mercer et al. | 534/551 |
| 5,270,453 | 12/1993 | Lau et al. | 534/550 |
| 5,658,994 | 8/1997 | Burgoyne, Jr. et al. | 525/390 |
| 5,776,376 | 7/1998 | Newsham et al. | 252/582 |

FOREIGN PATENT DOCUMENTS

| | | |
|---|---|---|
| 2052488 | 9/1991 | Canada . |
| 4238261 | 11/1992 | Germany . |
| 3165596 | 7/1991 | Japan . |
| 341814 | 1/1973 | U.S.S.R. . |
| 2197333 | 5/1988 | United Kingdom . |

OTHER PUBLICATIONS

Robeson, L.M.; Farnham, A. G.; McGrath, J. E. in "Molecular Basis of Tansitions and Relaxations", edited by Dale J. Meier, Gordon and Breach Science Publishers, New York, pp. 405–425.

Robeson, L.M.; Farnham, A. G.; McGrath, J. E. ACS Polymer Preprints 16 476 (1975).

Encyclopedia of Polymer Science and Engineering, $2^{nd}$ Ed., John Wiley & Sons, Inc.; New York; 1988; vol. 12, pp. 313–320.

Haas, T. W. in "Handbook of Plastic Materials and Technology", I. I. Rubin, Ed.; John Wiley & Sons, Inc.; New York; 1990; Chapter 25; pp. 277–293.

"Encyclopedia of Polymer Science and Engineering, $2^{nd}$ Ed.", John Wiley & Sons, Inc.; New York, 1988, vol. 13, pp. 196–211.

(List continued on next page.)

Primary Examiner—Jeffrey Mullis

[57] ABSTRACT

The present invention is directed to novel poly(arylene ethers), their synthesis and use in electronics applications as low dielectric insulating layers such as spin-on materials in integrated circuits. The polymers have repeating units of the structure:

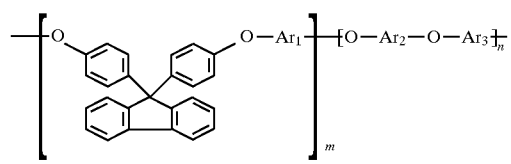

wherein $m=0.2$ to $1.0$; and $n=1.0-m$; and $Ar_1$, $Ar_2$ and $Ar_3$ are individually divalent arylene radicals selected from the group consisting of;

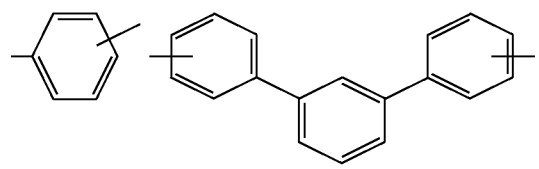

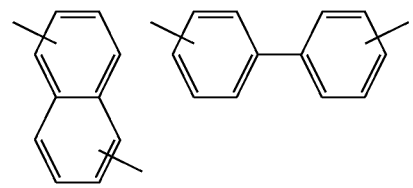

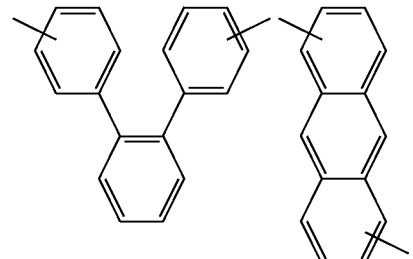

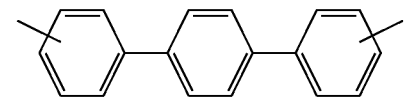

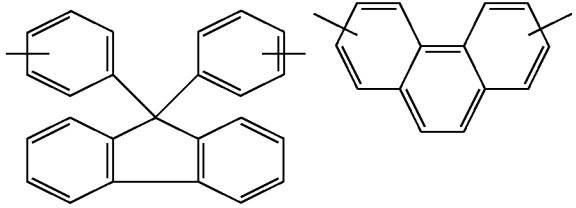

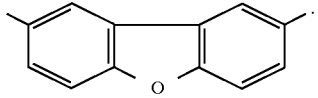

21 Claims, 1 Drawing Sheet

OTHER PUBLICATIONS

"Encyclopedia of Polymer Science and Engineering, $2^{nd}$ Ed.", John Wiley & Sons, Inc.; New York, 1988, vol. 13, pp. 1–30.

Bartges, B. A. in "Handbook of Plastic Materials and Technology", I. I. Rubin, Ed.; John Wiley & Sons, Inc.; New York; 1990; Chapter 25; pp. 395–407.

Neil Hendricks, Brad Wan and Aaron Smith reported in "Fluorinated Poly (aryl ethers) : Low Dielectric Constant, Thermally Stable Polymers for Sub–Half Micron IMD Applications" presented at the DUMIC Conference, Feb. 21–22, 1995, pp. 283–289.

Frank W. Mercer and Timothy D. Goodman reported in "Development of Low Moisture Adsorbing Low Dielectric Constant Dielectrics for Multichip Module Fabrication" in the proceedings of the International Electronics Packaging Conference, Marlborough, Massachusetts, Sep. 1990, pp. 1042–1062.

Frank Mercer, David Duff, Janusz Wojtowicz and Timothy Goodman in "Low Dielectric Constant Fluorinated Aryl Ethers Prepared From Decafluorobiphenyl" appearing in *Polymer Material Science Engineering,* vol. 66, 1992, pp. 198–199.

Frank W. Mercer and Timothy D. Goodman in "Factors Affecting the Moisture Adsorption and Dielectric Constant of Fluorinated Aromatic Polymers" appearing in *Polymer Preparation (American Chemical Society Divison of Polymer Chemistry)*, vol. 32(2), 1991, pp. 189–190.

L. M. Robeson, A. G. Farnham and J. E. McGrath in "Effect of Structure on the Dynamic Mechanical Behavior of Poly (Aryl Ethers)" appearing in *ACS Polymer Preprints,* vol. 16(1), pp. 476–479, 1975.

L. M. Robeson, A. G. Farnham and J. E. McGrath in "Synthesis and Dynamic Mechanical Characteristic of Poly (Aryl Ethers)" in *Applied Polymer Symposium No. 26* 1975, pp. 373–385.

M. J. Jurek and J. E. McGrath in "The Synthesis of Poly (Arylene Ethers) via the Ullmann Condensation Reaction-"appearing in *Polymer Preprint,* vol. 28 (11), 1987, pp. 180–183.

"Synthesis and Characterization of Fluorinated Aryl Ethers Prepared from Decafluorobiphenyl", J. Polym. Sci.: Part A: Polym. Chem, vol 30, pp. 1767–1770 (1992) (Mercer et al.)

Lau, et al. "Self–Crosslinkable Poly (arylene ether)s Containing Pendent Phenylenetriazene Groups," J. Polym. Sci.: Part A: Polymer Chem. vol. 32, pp. 1507–1521 (1994).

I. Colon and G. T. Kwiatkowski, "High Molecular Weight Aromatic Plymers by Nickel Coupling of Aryl Polychlorides" J. of Polym. Sci.: Part A: Polym Chem, vol. 28, pp. 367–383 (1990).

"Synthesis of Novel Poly(ether ketone)s Containing the o–Dibenzoylbenzene Moiety" Macromolecues 1991, 2637–2639 *America Chemical Society.*

NONFUNCTIONALIZED POLY(ARYLENE ETHERS)

TECHNICAL FIELD OF THE INVENTION

The present invention is directed to the field of poly (arylene ethers) which do not contain any functional or reactive groups in the polymer, such as activated fluorine substituents. More particularly, the present invention is directed to nonfunctionalized poly(arylene ethers) which have utility as low dielectric insulating layers in electronics applications and articles containing such poly(arylene ethers).

BACKGROUND OF THE INVENTION

The electronics fabrication industry uses dielectric materials as insulating layers between various circuits and layers of circuits in integrated circuits and related electronic devices. As the electronics fabrication industry moves toward more compact circuitry with finer circuit or line geometry in more densely-packed circuit patterns, the dielectric constant requirements of the insulating layers grows more demanding for lower values.

Therefore, there is a need in the electronic, fabrication industry for the replacement of silica-based, interlayer dielectric materials with materials of lower dielectric values. Silica and its modified versions have dielectric values on the order of 3.0 to 5.0 and usually 4.0 to 4.5. Polymeric materials used as replacements for silica as interlayer dielectric materials can have values for dielectric constant in the range of 1.9 to 3.5, which values are highly dependent on the structure of the polymeric materials. To successfully replace silica as an interlayer dielectric material, the properties of polymeric materials must conform to the rigid manufacturing requirements for integrated circuits or microchips in the electronic fabrication industry.

Various polymers have been proposed and utilized as dielectric materials for integrated circuits, wherein such polymeric materials include polyimides and fluorinated poly (arylene ethers).

The presence of fluorine in polymeric dielectric materials was utilized to achieve several results. In the polyimides, fluorine containing substituents lowered the dielectric value, reduced the hydrophilicity, enhanced optical transparency and controlled the solubility of polyimides in organic solvents. The presence of fluorine in the fluorinated poly (arylene ethers) which were proposed as substitutions for low dielectric materials enhanced the synthesis of the fluorinated poly(arylene ethers) by activating the appropriate sites in the polymer precursors as well as providing low dielectric values. In addition, polyimides have been altered with thermally unstable derivatives which decompose to gaseous byproducts to provide a self-foaming polyimide dielectric material which has reduced dielectric constants taking advantage of the low dielectric constant value of air which is 1.00.

Neil Hendricks, Brad Wan and Aaron Smith reported in "Fluorinated Poly(aryl ethers): Low Dielectric Constant, Thermally Stable Polymers for Sub-Half Micron IMD Applications" presented at the DUMIC Conference, Feb. 21–22, 1995, pages 283–289, polymers of fluorinated poly (aryl ethers) developed at Allied Signal provide low dielectric constant, interlayer dielectric materials. These fluorinated poly(aryl ethers) were found to have low dielectric constants and extremely low levels of adsorption and outgassing of moisture during processing. As depicted in FIG. 3 of the article, $SiF_4$ was detected as a decomposition product of the polymer at temperatures of about 540° C. The polymers were representative of those disclosed in U.S. Pat. No. 5,115,082.

Frank W. Mercer and Timothy D. Goodman reported in "Development of Low Moisture Adsorbing Low Dielectric Constant Dielectrics for Multichip Module Fabrication" in the proceedings of the International Electronics Packaging Conference, Marlborough, Mass., September 1990, pages 1042–1062, that various polyimides can be used as dielectric materials for multichip modules by fluorinating the polymers up to 20% fluorine by weight of the polymer. The incorporation of fluorine-containing groups produce a reduction in dielectric constant and moisture adsorption.

Frank Mercer, David Duff, Janusz Wojtowicz and Timothy Goodman in "Low Dielectric Constant Fluorinated Aryl Ethers Prepared From Decafluorobiphenyl" appearing in *Polymer Material Science Engineering*, Vol. 66,1992, pages 198–199, report five new fluorinated poly(aryl ethers). Polymer No. 2 was produced using 9,9-bis(4-hydroxyphenyl) fluorene. The polymers were cited to have good properties for electronic applications.

Frank W. Mercer and Timothy D. Goodman in "Factors Affecting the Moisture Adsorption and Dielectric Constant of Fluorinated Aromatic Polymers" appearing in *Polymer Preparation* (*American Chemical Society Division of Polymer Chemistry*), Vol. 32(2), 1991, pages 189–190, disclose that dielectric values of polyimides and fluorinated poly(aryl ethers) are dependent on the presence of polarizable groups such as imide linkages, as well as ketones, sulfones, and nitrile groups. The reported polymers had either these polarizable groups or activated fluorine in their chemical structure. The presence of the polarizable groups was disclosed to have detrimental effects on dielectric constants and moisture adsorption.

Raychem Corporation has patented various fluorinated poly(aryl ethers) which may be crosslinked and/or end capped to control polymer parameters, which polymers are recited to have desirable properties for dielectric materials used in integrated circuit fabrication. These patents include U.S. Pat. No. 5,108,840, U.S. Pat. No. 5,114,780, U.S. Pat. No. 5,145,936, U.S. Pat. No. 5,155,175, U.S. Pat. No. 5,173,542, U.S. Pat. No. 5,204,416, U.S. Pat. No. 5,235,044, U.S. Pat. No. 5,270,453 and U.S. Pat. No. 5,179,188.

L. M. Robeson, A. G. Farnham and J. E. McGrath in "Effect of Structure on the Dynamic Mechanical Behavior of Poly(Aryl Ethers)" appearing in *ACS Polymer Preprints*, Vol. 16(1), page 476–479,1975, disclose the synthesis of various poly(aryl ethers), some of which have sulfone bridging groups and other which have oxygen-bridging groups. No particular utility is suggested for these polymers.

L. M. Robeson, A. G. Farnham and J. E. McGrath in "Synthesis and Dynamic Mechanical Characteristics of Poly (Aryl Ethers)" in *Applied Polymer Symposium* No. 26 1975, pages 373–385, disclose poly(aryl ethers) with sulfone bridging groups. Ether linkages and carbon-to-carbon chemical bonds are also contemplated in replacement of the sulfone bridging unit.

U.S. Pat. No. 3,332,909 discloses polyarylene polyethers having various dihydric dinuclear phenyls wherein R and R' can be hydrocarbon radicals having 1 to 18 carbon atoms, inclusive. The utility of these polymers is recited to be for shaped and molded articles in the preparation of film and fiber products.

M. J. Jurek and J. E. McGrath in "The Synthesis of Poly(Arylene Ethers) via the Ullmann Condensation Reaction" appearing in *Polymer Preprint*, Vol. 28(11), 1987, pages 180–183, disclose the cuprous catalyst-driven condensation between a halogenated monomer and a dihydric phenyl to produce poly(arylene ethers). The polymers are described as having enhanced radiation stability and lower moisture adsorption relative to polyether sulfones, but no other utility is provided.

The prior art has synthesized various poly(arylene ethers) by the Ullman condensation using cuprous catalysts. These poly(arylene ethers) have not been identified with a particular utility other than as moldable or castable polymers. The prior art has also suggested the use of fluorinated polyimides and fluorinated poly(arylene ethers) produced by different syntheses for use as low dielectric materials in interlayer dielectric materials for integrated circuits and electronic devices. However, these two classes of polymers are not fully acceptable for interlayer dielectric materials due, in the case of polyimides, to the polarizable groups and the hydrophilicity of the materials in the presence of water or high relative humidity, and in the case of fluorinated poly(arylene ethers), the potential evolution of fluorinated byproducts at elevated temperatures and the reactivity of the fluorinated groups, especially with metals. The present invention overcomes these drawbacks for a material and particularly a polymer useful as a replacement for silica-based dielectric material by providing a novel composition of a poly(arylene ether) which does not have fluorinated substituents or significantly polarizable or reactive functional groups, while providing a low dielectric constant, high thermal stability, and low hydrophilicity under high relative humidity conditions, as will be set forth in greater detail below.

BRIEF SUMMARY OF THE INVENTION

The present invention is a poly(arylene ether) comprising repeating units of the structure:

wherein m=0.2 to 1.0; and n=1.0–m; and $Ar_1$, $Ar_2$ and $Ar_3$ are individually divalent arylene radicals.

Preferably, $Ar_1$, $Ar_2$ and $Ar_3$ are individually selected from the group consisting of;

Preferably, m=0.5–1.0.
Preferably, m=0.5 and n=0.5.
Alternatively, m=1 and $Ar_1$ is biphenyl diradical.
Further alternatively, m=1 and $Ar_1$ is terphenyl diradical.
The present invention is also a method of synthesizing a poly(arylene ether) having repeating units of the structure:

wherein m=0.2 to 1.0; and n=1.0–m; and $Ar_1$, $Ar_2$ and $Ar_3$ are individually divalent arylene radicals selected from the group consisting of;

-continued and

, comprising contacting the alkali metal salt of 9,9-bis(4-hydroxyphenyl)fluorene (or a combination of that monomer with other recited arylene monomers in the diol form) with one or more dihalogenated arylene of $Ar_1$, and/or $Ar_3$ in the presence of a cuprous catalyst in the presence of a solvent at an elevated temperature in the range of 100° C. to 300° C. and recovering the resulting poly(arylene ether) product.

Preferably, the 9,9-bis(4-hydroxyphenyl)fluorene is present in approximately a stoichiometric amount in relation to the dihalogenated arylenes of $Ar_1$, and/or $Ar_3$.

Preferably, the alkali metal salt of 9,9-bis(4-hydroxyphenyl)fluorene is synthesized by reacting 9,9-bis(4-hydroxyphenyl)fluorene in an appropriate solvent with an alkali metal hydroxide with removal of the formed water by azeotropic distillation of the water and the solvent.

Preferably, the poly(arylene ether) product is recovered by cooling and precipitation from the solvent.

The present invention is also a multilayer electronic circuit article comprising (i) a silicon, glass or ceramic substrate, (ii) a plurality of layers or regions of an insulating material on a surface of the substrate, and (iii) at least one layer or region of a conductive material selected from the group consisting of metals and semiconductive materials, interposed between adjacent layers of the insulating material or within a layer of the insulating material, the insulating material comprising a poly(arylene ether) comprising repeating units of the structure:

wherein m=0.2 to 1.0; and n=1.0–m; and $Ar_1$, $Ar_2$ and $Ar_3$ are individually divalent arylene radicals selected from the group consisting of;

and

Preferably, m=0.5–1.0.
Preferably, m=0.5 and n=0.5.
Alternatively, m=1 and $Ar_1$ is biphenyl diradical.
Further alternatively, m=1 and $Ar_1$ is terphenyl diradical.

The present invention is further a multichip module comprising a substrate, a plurality of semiconductor chips carried on the substrate and a multilayer interconnect which electronically connects the semiconductor chips and comprises plural layers or regions of conductive material and plural layers or regions of a dielectric material, wherein the dielectric material comprises a poly(arylene ether) comprising repeating units of the structure:

wherein m=0.2 to 1.0; and n=1.0–m; and $Ar_1$, $Ar_2$ and $Ar_3$ are individually divalent arylene radicals selected from the group consisting of;

Preferably, m=0.5–1.0.
Preferably, m=0.5 and n=0.5.
Alternatively, m=1 and $Ar_1$ is biphenyl diradical.
Further alternatively, m=1 and $Ar_1$ is terphenyl diradical.

DETAILED DESCRIPTION OF THE INVENTION

As interconnect dimensions in integrated circuits shrink well below one-half micron, traditional interlayer dielectrics, with their relatively high dielectric constants, provide unacceptable levels of capacitance in interconnects. There is a need in the integrated circuit (IC) industry for the replacement of silica based, interlayer dielectric (ILD) materials with materials of lower dielectric ($\epsilon$) values. Silica and its modified versions have $\epsilon$ values on the order of 3.0–5.0 (usually 4.0–4.5).

Organic polymers are, in general, known to exhibit significantly lower dielectric constants than inorganic oxides and nitrides, and thus may be considered as candidates for the intermetal dielectric in future integrated circuits. However, the challenges associated with integrating organic polymers are significant. For example, the thermal and thermal-oxidative stability of most organic polymers is far too low to allow integration, given current typical back-end-of-the-line process temperatures. Some classes of polymers, notably polyimides and other polymers based largely or exclusively on aromatic linking groups, appear to exhibit sufficient thermal stability to withstand current back end processing temperatures. Additional key requirements in polymer dielectric candidates include (a) low dielectric constants to provide significant reductions in capacitance, and (b) extremely low levels of adsorption and/or outgassing of moisture during thermal processing.

Polymeric materials can have $\epsilon$ values in the range of 1.9–3.5, which is highly dependent on the structure. The present invention provides a new family of polymeric materials that are superior to the currently considered polymeric materials for this application and other applications, such as multichip module packaging, encapsulation and flat panel display. The poly(arylene ethers) of the present invention exhibit an excellent combination of thermal stability, low dielectric constant, low moisture absorption and low moisture outgassing. In order to replace silica as an ILD, the properties of the polymeric material must conform to the rigid manufacturing requirements for microchips. Table 1 summarizes the requirements set by IC manufacturers.

m; and $Ar_1$ and $Ar_3$ are individually divalent arylene radicals.

The monomers $Ar_1$, $Ar_2$ and/or $Ar_3$, which represent one or more aromatic ring structures can be selected from the following structures (usually in the dihalogenated, $Ar_1$ and $Ar_3$, or potentially the dihydroxy form, $Ar_2$, prior to polymerization, preferably the dibrominated form, $Ar_1$ and $Ar_3$, or potentially for the dihydroxy form, the potassium, sodium or lithium salt thereof, $Ar_2$, respectively, wherein the mix of monomers is such that a dihalogenated monomer, $Ar_1$ and/or $Ar_3$, and potentially a dihydroxy monomer, $Ar_2$, are

TABLE 1

Summary of Low ε, ILD Requirements Set by IC Manufacturers

| | |
|---|---|
| * Thermal Stability | Must have thermal stability >400° C. in vacuum or forming gas (N2 with 4% $H_2$). CVD Tungsten Deposition: 400–480° C. CVD Copper Deposition: 250–275° C. |
| * Dielectric Constant | Below 3.0, preferably 1.7 or lower. |
| * Moisture Absorption | Less than 0.5 wt %. |
| * Isotropic Dielectric Const. | No anisotropy. Perpendicular and parallel dielectric constants must be the same and uniform across the wafer. |
| * High Tg | Greater than 400° C. or greater than 250° C. if crosslinked. |
| * Adhesion to Cu, Al, $SiO_2$ and Si | This is a must but adhesion promoters can be used. |
| * Low stress | Optimum CTE (coefficient of thermal expansion)would be the same as for $SiO_2$. |
| * Must be patternable | Should be directionally etchable by RIE (reactive ion etching). |
| * Chemical Compatibility | No reactivity with metals (i.e. possible reaction between Al lines and fluorinated polymers at elevated temperatures; Solubility of Cu in some polymers) |
| * No solvent absorption | No swelling due to photo resist solvents. |
| * Compatibility with CMP (chemical-mechanical polishing) | Necessary if Damacene process used. |

The present invention is a non-functionalized poly (arylene ether) comprising repeating units of the structure:

wherein m=0.2 to 1.0; and n=1.0–m; and $Ar_1$, $Ar_2$ and $Ar_3$ are individually divalent arylene radicals.

More preferably, the polymers of the present invention have repeating units of the structure:

selected for co-etherification in the Ullman condensation; however it is possible to have a diradical in which halogenated functionality and hydroxy functionality are both present):

A-phenylene:

B-biphenyl diradical:

C-para-terphenyl diradical:

D-meta-terphenyl diradical:

E-ortho-terphenyl diradical:

F-naphthalene diradical:

G-anthracene diradical:

H-phenanthrene diradical:

I-diradical of 9,9-diphenylfluorene of the type:

J-4,4'-diradical of dibenzofuran

The other monomer making up the basic repeat unit of the polymer of the present invention is 9,9-bis(4-hydroxyphenyl)fluorene, with a structure of:

K-9,9-bis(4-hydroxyphenyl)fluorene

Variations in $Ar_1$, $Ar_2$ and $Ar_3$ allow access to a variety of properties such as reduction or elimination of crystallinity, modulus, tensile strength, etc. while the 9,9-bis(4-hydroxyphenyl)fluorene link provides a high glass transition temperature polymer. These polymers are essentially chemically inert, have low polarity, have no additional functional or reactive groups and are thermally stable to temperatures of 400°–450° C. in inert atmosphere.

In addition to the basic phenyl monomer or multiple phenyl radical or polynuclear aromatic monomer, as well as the diphenol comprising 9,9-bis(4-hydroxyphenyl)fluorene, the polymer of the present invention may also be crosslinked, either by crosslinking itself, through exposure to temperatures of greater than approximately 350° C., or by providing a crosslinking agent as well as end capping the polymer with known end cap agents, such as phenylethynyl, benzocyclobutene, ethynyl and nitrile.

The polymers can be homopolymers, consisting essentially of a single repeat unit, such as one of the aforementioned phenylene or biphenyl diradical and the I structure fluorene derivative combination or the polymers can be copolymers comprising a repeat unit of the structure of the present invention in combination with other repeat units of polyols and phenyls known in the art. For instance, the poly(arylene ether) polymers of the present invention can be a copolymer of the etherification of phenylene A with 9,9-bis(4-hydroxyphenyl)fluorene and biphenyl diradical B similarly etherified with the named fluorenylidene derivative K. Combinations of compounds A through J etherified with the identified fluorenylidene derivative K are also possible.

In a copolymer where repeat unit of this invention is combined with the repeat unit of another type of polymer, it is preferred that at least 60 mole %, more preferably at least 80 mole % of the repeat units are the polymers of the present invention. A copolymer can be alternating, random or block.

The polymers of this invention are non-functional in that they are chemically inert and they do not bear any functional groups that are detrimental to their application in the fabrication microelectronic devices. They do not have carbonyl moieties such as amide, imide, and ketone, which promote adsorption of water. They do not bear halogens such as fluorine, chlorine, bromine, and iodine which can react with metal sources in metal deposition processes. They are composed of essentially aromatic carbons, except for the bridging carbon in the 9,9-fluorenylidene group (perphenylated) or the oxygen of the compound J, above.

The polymers of the present invention may be used in a multichip module wherein a substrate typically made of silicon, glass or ceramic supports high density, multilayer interconnects in which the dielectric material providing insulation between the various layers is the polymer of the present invention. On the interconnects are mounted semiconductor chips which are connected to each other by electrical conductors in the interconnect. The substrate may also contain electrical conductors, for example, for power and ground. Lead frames provide connections to external circuitry. In such multilayer interconnects, layers of electrical connections are separated from each other by the polymers of the present invention. The polymers of the present invention can also separate various regions of conductors, such as between various discrete conductors in a common layer. A via can provide connection between the various layers as necessary. The interconnect is connected to an integrated circuit chip by a bond pad. The via can be in a stacked pillar design, although other designs conventional in the art, such as stair-stepped or nested via designs, can be used. Other multichip module designs in which the polymers of the present invention can be used are known in the prior art.

The poly(arylene ethers) of the present invention can also be used as interlayer dielectrics in an interconnect associated with a single integrated circuit chip. An integrated circuit chip would typically have on its surface plural layers of the poly(arylene ether) dielectric and multiple layers of metal conductors. It can also include regions of the poly(arylene ether) dielectric between discrete metal conductors or regions of conductor in the same layer or level of an integrated circuit. The poly(arylene ether) polymer can also be used in conjunction with conventional silicon, where the polymer is used between the metal lines on a layer with silicon used as the dielectric material between layers of conductor material.

The poly(arylene ethers) of the present invention can further be used as protective coatings on integrated circuit chips for protection against alpha particles. Semiconductor devices are susceptible to soft errors when alpha particles emitted from radioactive trace contaminants in the packaging or other nearby materials strike the active surface. An integrated circuit can be provided with a protective coating of the poly(arylene ether) of the present invention. Typically, an integrated circuit chip would be mounted on a substrate and held in place with an appropriate adhesive. A coating of the poly(arylene ether) of the present invention provides an alpha particle protection layer for the active surface of the chip. Optionally, additional protection is provided by encapsulant made of, for example, epoxy or a silicone.

The poly(arylene ethers) of the present invention can also be used as a substrate (dielectric material) in circuit boards or printed wiring boards. The circuit board made up of the poly(arylene ether) of the present invention has mounted on its surface patterns for various electrical conductor circuits. The circuit board may include, in addition to the poly (arylene ether) of the present invention, various reinforcements, such as woven nonconducting fibers, such as glass cloth. Such circuit boards may be single sided, as well as double sided or multilayer.

Films or coatings of the poly(arylene ether) of the present invention can be formed by solution techniques such as spraying, spin coating or casting, with spin coating being preferred. Preferred solvents are 2-ethoxyethyl ether, cyclohexanone, cyclopentanone, toluene, xylene, chlorobenzene, N-methyl pyrrolidinone, N,N-dimethylformamide, N,N-dimethylacetamide, methyl isobutyl ketone, 2-methoxyethyl ether, 5-methyl-2-hexanone, γ-butyrolactone, and mixtures thereof. Typically, the coating thickness is between about 0.1 to about 15 microns. As a dielectric interlayer, the film thickness is less than 2 microns.

Additives can be used to enhance or impart particular target properties, as is conventionally known in the polymer art, including stabilizers, flame retardants, pigments, plasticizers, surfactants, and the like. Compatible or non-compatible polymers can be blended in to give a desired property.

Adhesion promoters can also be used to adhere the poly(arylene ether) polymers of the present invention to the appropriate substrates. Such promoters are typified by hexamethyidisilazane, which can be used to interact with available hydroxyl functionality that may be present on a surface, such as silicon dioxide, which has been exposed to moisture or humidity that creates such hydroxyl functionality.

Polymers for microelectronic applications desirably contain low levels (generally less than 1 ppm, preferably less than 10 ppb) of ionic impurities, particularly for dielectric interlayers. The synthetic procedure outlined by the Ullman condensation has three major sources of potential contamination, which must be removed for the Ullman condensation to be a viable synthesis. Those sources of contamination are copper catalyst, sodium from the salt of the hydroxy precursor and halogen such as bromine from the arylene precursor. It is surprising that the present invention could be achieved with the necessary purities by the Ullman condensation. When appropriate purification and coagulation/extraction procedures were identified which resolved this significant problem for the first time, it was found that the Ullman condensation could produce high purities of the polymers of the present invention.

The poly(arylene ethers) show good high temperature stability. They also can be crosslinked at elevated temperatures in the range of 350° to 450° C. The ability to crosslink at elevated temperature makes the poly(arylene ethers) of the present invention particularly useful in microelectronic applications because they can be readily applied from solution and then converted into a solvent-resistant coating by heating.

The poly(aryl ethers) are prepared in high linear molecular weight by proper modification of the Ullman reaction. Ullman first illustrated that copper powder is a catalyst for making aromatic ethers by this reaction. It has been indicated that the cuprous ion is the active catalyst and not $Cu^0$ or $Cu^{++}$. In oxidative coupling systems, copper acts in a redox fashion, alternating between $Cu^{++}$ and $Cu^+$, and reactions occur at relatively low temperatures. Studies on the mechanism of the Ullman reaction conclude that $Cu^+$ is the active species and coordinates with the π system of the aromatic halide, thus facilitating carbon-halogen cleavage. This scheme is essentially a nucleophilic aromatic substitution. With the Ullman reaction, the order of ease of halide replacement is I, Br>Cl>>F which is the reverse of the order observed for the activated halide for polyether-forming reactions. The Ullman reaction requires high temperature, such as 180° to 230° C. Solvent type is not critical as long as it is inert and is a solvent for the polyether formed. By contrast, with active halide reactions, the solvent is critical and restricted to a few solvents when low reaction temperatures are employed. Therefore, nucleophilic aromatic substitution of nonactivated aryl halides can be accomplished using the Ullman condensation reaction.

It is contemplated to use one or more dihalogenated phenyl-based compounds of the type A through J listed above, as $Ar_1$ and/or $Ar_3$, in reaction with the 9,9-bis(4-hydroxyphenyl)fluorene and potentially the alkali metal salt of the dihydroxy form of a compound of the type A through J, as $Ar_2$. Thus, the repeating unit of the poly(arylene ether) polymers of the present invention may include one or more mixtures of the arylene derivatives or polynuclear aromatics in a halogenated or alkali metal salt diol precursor identified with the structures A through J above.

Alternatively, aromatic structures comprising one hydroxyl and one halogen on the arylene diradical can be employed in the synthesis procedure noted above. These structures can be combined with other monohydroxyl/monohalogenated structures, as well as, dihydroxyl and dihalogenated arylene diradicals. The key to the desired molecular weight will, of course, be the hydroxyl/halogen ratio.

The poly(arylene ethers) of the present invention can be prepared in a substantially equal molar reaction of a double alkali metal salt of the dihydric 9,9-bis(4-hydroxyphenyl) fluorene, and potentially a dihydric form of a compound of the type A through J, with preferably one or more dibromo arylene derivatives of the structures A through J in the presence of a cuprous salt or cuprous salt complex as a catalyst. Any alkali metal salt of the dihydric 9,9-bis(4-hydroxyphenyl)fluorene derivative, or additionally the dihydric form of a compound of type A through J, can be used as one of the reactants. For the purpose of this invention, to obtain a high molecular weight polymer, it is preferred to conduct the reaction under substantially anhydrous conditions and in an oxygen-free atmosphere.

Generally, the reaction is carried out in an inert diluent in which the alkali metal salt of the dihydric 9,9-bis(4-hydroxyphenyl)fluorene derivative (or additionally other dihyric compounds of the type A through J) and/or the dibromo arylene derivative of structures A through J is partly soluble. Suitable solvents include benzophenone, diphenyl ether, benzonitrile, dialkoxy benzenes in which alkoxy group contains 1 to 4 carbon atoms, trialkoxy benzenes in which each alkoxy group contains 1 to 4 carbon atoms, diphenyl sulfone, dimethylsulfoxide, dimethylsulfone, diethylsulfoxide, diethylsulfone, diisopropylsulfone, tetrahydrothiophene, 1,1-dioxide (tetramethylene sulfone or sulfolane), tetrahydrothiophene-1 monoxide, and the like.

The double alkali metal salt of the dihydric 9,9-bis(4-hydroxyphenyl)fluorene derivative generally exists in the hydrate form which should be dehydrated separately or in the reaction mass to insure anhydrous conditions. Similarly, the alkali metal salt can be prepared in situ in the inert diluent by reacting the dihydric 9,9-bis(4-hydroxyphenyl) fluorene derivative with an alkali metal, alkali metal hydroxide, alkali metal hydride, alkali metal hydroxide, alkali metal carbonate or alkali metal alkyl compound, and thereafter removing water, by distilling off a water-containing azeotrope from the reaction mass or by like techniques, to obtain anhydrous conditions. Benzene, xylene, halogenated benzenes, toluene, and other inert azeotrope forming organic liquids are suitable for this purpose. In the event other dihydric compounds of type A through J are also used, similar treatment to that described is appropriate.

The cuprous catalyst employed in the reaction can be a cuprous salt, such as cuprous halide, for example, cuprous chloride, cuprous bromide or cuprous iodide. Cuprous halides are preferred since they are highly effective, but other cuprous salts can also be employed, for instance, cuprous acetate, cuprous formate, and the like. The cuprous catalyst can also be a complex of any of the foregoing cuprous salts obtained by combining the cuprous salt with a complexing agent such as pyridine, dimethyl acetamide, quinoline, dimethylformamide, n-methylpyrrolidone, and the like. The quantity of the complexing agent can be varied widely, but is usually in excess of the cuprous salt.

The preferred reaction between the dibromo arylene structures A through J and the alkali metal salt of the dihydric 9,9-bis(4-hydroxyphenyl)fluorene derivative (with or without additional diols of the structures A through J) proceeds on an equal molar basis. Variations in the molecular weight distribution can be obtained by varying the ratios of the diol and the dibromide.

Reaction temperatures above room temperature and generally above 100° C. are preferred. More preferred are temperatures between 180° C. to 250° C. Higher temperatures can lead to degradation or decomposition of the reactants, the polymer and the solvents employed.

The polymer is recovered from the reaction mass in any convenient manner, such as by precipitation induced by cooling the reaction mass or by adding a nonsolvent for the polymer, or the solid polymer can be recovered by stripping off the solvent at reduced pressures or elevated temperatures.

Since the polymerization reaction results in the formation of the alkali metal halide (typically bromide) on each coupling reaction, it is preferred to either filter the salts from the polymer solution or to wash the polymer to substantially free it from these salts.

Other synthesis techniques for the polymers of the present invention are possible and are contemplated, such as potentially nickel catalyst coupling syntheses, as are known in the art. See I. Colon et al., J. Poly. Sci., Part A, Poly. Chem. Vol.28, pp 367–383 (1990).

Structures of specific poly(arylene ether)s prepared are as follows. PAE-1 represents a composition which is embodied by U.S. Pat. No. 3,332,909 and is used as a comparative example.

PAE-1

-continued

Figure 1:
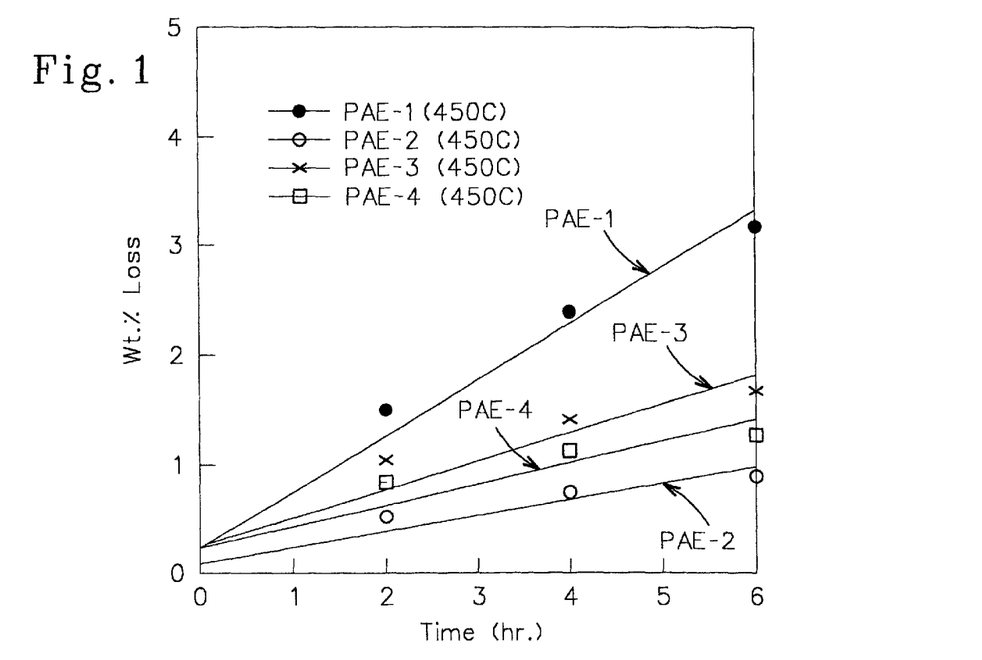
FIG. 1 is a graph of thermal stability of polymers of the present invention (PAE-2 to 4) compared to a polymer of the prior art (PAE-1) at 450° C. under nitrogen atmosphere as a function of time. Thermal stability is measured by percent weight loss.

Comparison of isothermal stability data (450° C.) (Table 4 and FIG. 1) shows that the poly(arylene ether) PAE-1 does not have the thermal stability that PAE-2, PAE-3, and PAE-4 have and which is required for interlayer dielectric applications in microelectronics. FIG. 1 shows thermal stability as % weight loss versus time at 450° C. in nitrogen. The thermal stability of the polymers of the present invention are markedly superior to the prior art polymer PAE-1.

As shown in Table 3, PAE-1, has a much lower glass transition temperature than the other poly(arylene ether)s covered by the present invention.

In a recent article (Hendricks, N. H.; Wan, B.; Smith, A.; *Proceedings First International Dielectrics for VLSI/ULSI multilevel Interconnection Conference* (DUMIC), 1995, pp 283–89.), evidence was provided that ring fluorinated, poly (arylene ether)s can react with a silicon surface, affording SiF4, at elevated temperatures. One skilled in chemistry would also anticipate that these fluorinated polymers would also react with metals, such as copper, aluminum, and tungsten, at elevated temperatures required for microchip manufacture.

EXAMPLE 1 (COMPARATIVE EXAMPLE)

A mixture of 33.624 g (0.1000 mol) of 2,2-bis-(4-hydroxyphenyl)-1,1,1,3,3,3-hexafluoropropane, 75 g of toluene, and 100 g of benzophenone was charged to a 500 mL, 3-necked, round-bottomed flask fitted with a Dean-Stark trap, condenser, nitrogen inlet, mechanical stirrer, and thermometer. The mixture was heated to 60° C. with stirring and a nitrogen atmosphere. After homogeneity had been reached, 16.000 g of a 50.00 wt % aqueous solution of sodium hydroxide (0.2000 mol of sodium hydroxide) was slowly added over 10 min. The reaction mixture was heated to ca. 140° C. and the water azeotrope was collected. After 4 hr. and complete dehydration was ensured, the temperature of the reaction mixture was increased to 200° C. and the toluene was removed via distillation. The reaction mixture was cooled to 80° C. and 31.202 g (0.1000 mol) of 4,4'-dibromobiphenyl was added. The reaction mixture was then heated to 200° C. A 15 mL portion of a freshly prepared copper (I) chloride/quinoline solution (containing ca. 0.15 g of copper (I) chloride, 1.00 mmol) was added and reaction mixture was maintained at 200° C. for 17 hr. A 10 g portion of bromobenzene was then added. After 1 hr., the reaction mixture was cooled to 100° C., and 200 g of toluene was added. The reaction mixture was then quenched in a rapidly stirred solution of 25 g of acetic acid in 1000 g of methanol. The precipitate was isolated and placed in 2 L of boiling water for 8 hr. The precipitate was first dried in an oven (100° C.) then dissolved in 300 g of tetrahydrofuran. The polymer solution was filtered then precipitated in 1 L of methanol. The precipitate was collected, washed with methanol, then dried in a vacuum oven (100° C.) overnight.

This procedure afforded 39.46 g of polymer, PAE-1, which possessed the properties listed in Tables 2.

EXAMPLE 2 (COMPARATIVE EXAMPLE)

The procedure of Example 1 was repeated except that the catalyst was prepared as follows. Copper (I) chloride (3.00 g, 0.223 mol) was added to 20 g of freshly distilled quinoline contained under a nitrogen blanket. The mixture was stirred at 25° C. for 48 hr. A 10 mL portion of the decanted liquid was used as catalyst.

The procedure afforded 37.15 g of polymer, PAE-1, which possessed the properties listed in Tables 2, 3 and 4.

EXAMPLE 3 (MONOMER B)

In a 50 mL flask, 3.00 g, 0.223 mol) of copper (I) chloride was added to 20 g of freshly distilled quinoline contained under a nitrogen blanket. The mixture was stirred at 25° C. for 48 hr. A 10 mL portion of the decanted liquid was used as catalyst.

A mixture of 35.0421 g (0.1000 mol) of 9,9-bis(4-hydroxyphenyl)fluorene, 75 g of toluene, and 100 g of benzophenone was charged to a 500 mL, 3-necked, round-bottomed flask fitted with a Dean-Stark trap, condenser, nitrogen inlet, mechanical stirrer, and thermometer. The mixture was heated to 60° C. with stirring and a nitrogen atmosphere. After homogeneity had been reached, 16.000 g of a 50.00 wt % aqueous solution of sodium hydroxide (0.2000 mol of sodium hydroxide) was slowly added over 10 min. The reaction mixture was heated to ca. 140° C. and the water azeotrope was collected. After 4 hr. and complete dehydration was ensured, the temperature of the reaction mixture was increased to 200° C. and the toluene was removed via distillation. The reaction mixture was cooled to 80° C. and 31.202 g (0.1000 mol) of 4,4'-dibromobiphenyl was added. The reaction mixture was then heated to 200° C. A 10 mL portion of the copper (I) chloride/quinoline catalyst was added to the reaction mixture. The reaction mixture was maintained at 200° C. for 17 hr. After which time, most of the disodium salt of the 9,9-bis(4-hydroxyphenyl)fluorene had gone into solution. A 0.15 g portion of dry copper (I) chloride powder was added to the reaction mixture. The reaction mixture was then maintained at 200° C. for an additional 24 hr. A 10 g portion of bromobenzene was then added. After 1 hr., the reaction mixture was cooled to 100° C., and 200 g of toluene was added. The reaction mixture was then quenched in a rapidly stirred solution of 25 g of acetic acid in 1000 g of methanol. The precipitate was isolated and placed in 2 L of boiling water for 8 hr. The precipitate was first dried in an oven (100° C.) then dissolved in 300 g of tetrahydrofuran. The polymer solution was filtered then precipitated in 1 L of acetone. The precipitate was collected, dissolved in 300 g of tetrahydrofuran, then re-precipitated in 1 L of acetone. After collecting the polymer, it was dried in a vacuum oven (100° C.) overnight.

This procedure afforded approximately 42 g of polymer which possessed the properties listed in Tables 2, 3 and 4. Analysis of the polymer by ICP-AES (inductively coupled plasma-atomic emission spectrometry) revealed that the copper and sodium contents in the dry polymer were less than 3.40 ppm and 6.00 ppm, respectively.

EXAMPLE 4 (MONOMER C)

The general procedure for Example 3 was followed for the condensation of 35.0421 g (0.1000 mol) of 9,9-bis(4-hydroxyphenyl)fluorene with 38.8104 g (0.1000 mol) of 4,4"-dibromoterphenyl. With a total reaction time of 41 hr., the procedure afforded ca. 36.8 g of polymer which possessed the properties listed in Tables 2, 3, and 4.

In a 50 mL flask, 3.00 g, 0.223 mol) of copper (I) chloride was added to 20 g of freshly distilled quinoline contained under a nitrogen blanket. The mixture was stirred at 25° C. for 48 hr. A 10 mL portion of the decanted liquid was used as catalyst.

A mixture of 35.0421 g (0.1000 mol) of 9,9-bis(4-hydroxyphenyl)fluorene, 75 g of toluene, and 100 g of benzophenone was charged to a 500 mL, 3-necked, round-bottomed flask fitted with a Dean-Stark trap, condenser, nitrogen inlet, mechanical stirrer, and thermometer. The mixture was heated to 60° C. with stirring and a nitrogen atmosphere. After homogeneity had been reached, 16.000 g of a 50.00 wt % aqueous solution of sodium hydroxide (0.2000 mol of sodium hydroxide) was slowly added over 10 min. The reaction mixture was heated to ca. 140° C. and the water azeotrope was collected. After 4 hr. and complete dehydration was ensured, the temperature of the reaction mixture was increased to 200° C. and the toluene was removed via distillation. The reaction mixture was cooled to 80° C. and 38.8104 g (0.1000 mol) of 4,4"-dibromoterphenyl was added. The reaction mixture was then heated to 200° C. A 10 mL portion of the copper (I) quinoline catalyst was added to the reaction mixture. The reaction mixture was maintained at 200° C. for 17 hr. After which time, most of the disodium salt of the 9,9-bis(4-hydroxyphenyl)fluorene had gone into solution. A 0.15 g portion of dry copper (I) chloride powder was added to the reaction mixture. The reaction mixture was then maintained at 200° C. for an additional 24 hr. A 10 g portion of bromobenzene was then added. After 1 hr., the reaction mixture was cooled to 100° C., and 200 g of toluene was added. The reaction mixture was then quenched in a rapidly stirred solution of 25 g of acetic acid in 1000 g of methanol. The precipitate was isolated and placed in 2 L of boiling water for 8 hr. The precipitate was first dried in an oven (100° C.) then dissolved in 300 g of tetrahydrofuran. The polymer solution was filtered then precipitated in 1 L of acetone. The precipitate was collected, dissolved in 300 g of tetrahydrofuran, then re-precipitated in 1 L of acetone. After collecting the polymer, it was dried in a vacuum oven (100° C.) overnight. The properties are reported in Tables 2–4.

EXAMPLE 5 (MONOMERS B/C)

The general procedure for Example 3 was followed for the condensation of 35.0421 g (0.1000 mol) of 9,9-bis(4- hydroxyphenyl)fluorene with 15.6010 g (0.0500 mol) of 4,4'-dibromobiphenyl and 19.4052 g (0.0500 mol) of 4,4"-dibromoterphenyl. With a total reaction time of 41 hr., the procedure afforded ca. 43.8 g of polymer, PAE-4, which possessed the properties listed in Tables 2, 3 and 4.

In a 50 mL flask, 3.00 g, 0.223 mol) of copper (I) chloride was added to 20 g of freshly distilled quinoline contained under a nitrogen blanket. The mixture was stirred at 25° C. for 48 hr. A 10 mL portion of the decanted liquid was used as catalyst.

A mixture of 35.0421 g (0.1000 mol) of 9,9-bis(4-hydroxyphenyl)fluorene, 75 g of toluene, and 100 g of benzophenone was charged to a 500 mL, 3-necked, round-bottomed flask fitted with a Dean-Stark trap, condenser, nitrogen inlet, mechanical stirrer, and thermometer. The mixture was heated to 60° C. with stirring and a nitrogen atmosphere. After homogeneity had been reached, 16.000 g of a 50.00 wt % aqueous solution of sodium hydroxide (0.2000 mol of sodium hydroxide) was slowly added over 10 min. The reaction mixture was heated to ca. 140° C. and the water azeotrope was collected. After 4 hr. and complete dehydration was ensured, the temperature of the reaction mixture was increased to 200° C. and the toluene was removed via distillation. The reaction mixture was cooled to 80° C. and 15.6010 g (0.0500 mol) of 4,4'-dibromobiphenyl and 19.4052 g (0.0500 mol) of 4,4"-dibromoterphenyl were added. The reaction mixture was then heated to 200° C. A 10 mL portion of the copper (I)/qinoline catalyst was added to the reaction mixture. The reaction mixture was maintained at 200° C. for 17 hr. After which time, most of the disodium salt of the 9,9-bis(4-hydroxyphenyl)fluorene had gone into solution. A 0.15 g portion of dry copper (I) chloride powder was added to the reaction mixture. The reaction mixture was then maintained at 200° C. for an additional 24 hr. A 10 g portion of bromobenzene was then added. After 1 hr., the reaction mixture was cooled to 100° C., and 200 g of toluene was added. The reaction mixture was then quenched in a rapidly stirred solution of 25 g of acetic acid in 1000 g of methanol. The precipitate was isolated and placed in 2 L of boiling water for 8 hr. The precipitate was first dried in an oven (100° C.) then dissolved in 300 g of tetrahydrofuran. The polymer solution was filtered then precipitated in 1 L of acetone. The precipitate was collected, dissolved in 300 g of tetrahydrofuran, then re-precipitated in 1 L of acetone. After collecting the polymer, it was dried in a vacuum oven (100° C.) overnight.

TABLE 2

Molecular Weight Distribution for Examples 1–5.

| Example | Polymer Structure | Mw[a] | Mn[b] | Mw/Mn |
|---|---|---|---|---|
| 1 | PAE-1 | 20,000 | 7,700 poor film forming molecular weight | 2.58 |
| 2 | PAE-1 | 41,100 | 15,400 good film forming molecular weight | 2.66 |
| 3 | PAE-2 | 65,300 | 20,700 good film forming molecular weight | 3.16 |
| 4 | PAE-3 | 45,400 | 11,400 good film forming molecular weight | 3.98 |

TABLE 2-continued

Molecular Weight Distribution for Examples 1–5.

| Example | Polymer Structure | $M_w^a$ | $M_n^b$ | $M_w/M_n$ |
|---|---|---|---|---|
| 5 | PAE-4 | 75,800 | 25,700 good film forming molecular weight | 2.95 |

[a] Weight average molecular weight.
[b] Number average molecular weight.

TABLE 3

Glass Transition Temperature (Tg) of Poly(arylene ether)s, Examples 2–5, as Determined by DSC and by Dynamic Mechanical Analysis of Uncured (Thermoplastic) and Cured (Thermoset) Polymer.

| | Tg (°C.) | | |
|---|---|---|---|
| Polymer | via DSC[a] | via DMA of Uncured Polymer[b] | via DMA of Cured Polymer[b] |
| Example 2 PAE-1 | 166 | 182 | |
| Example 3 PAE-2 | 257 | 275 | 291 |
| Example 4 PAE-3 | 271 | 288 | |
| Example 5 PAE4 | 273 | 289 | |

Figure 2:
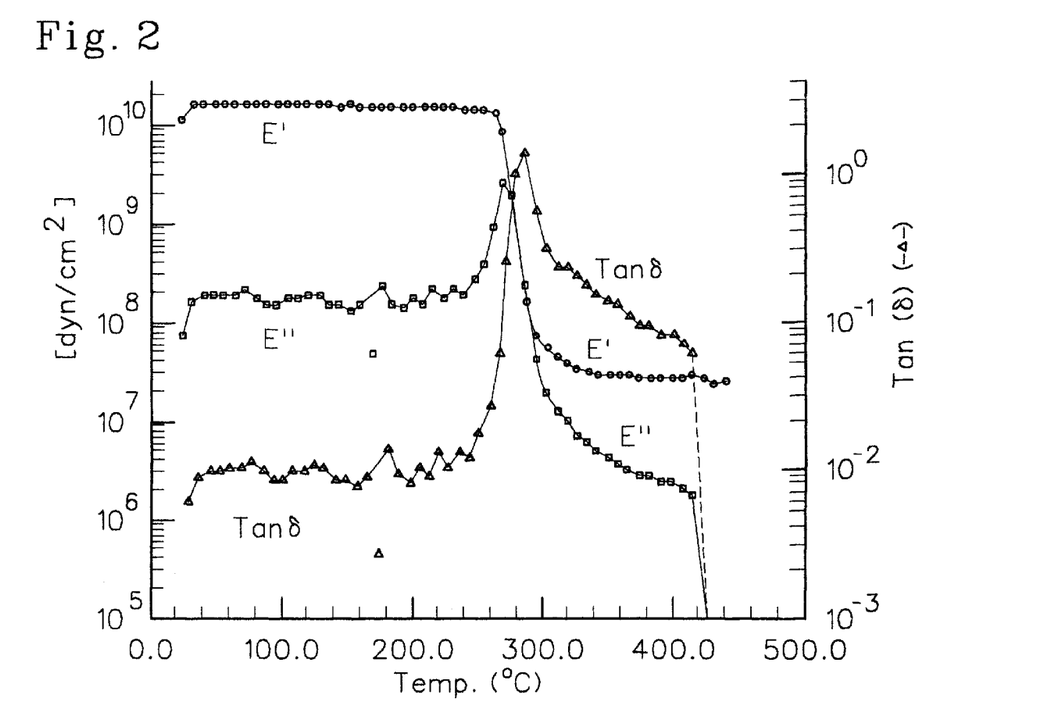
FIG. 2 is a graph of dynamic mechanical property of the polymer of the present invention synthesized in accordance with Example 3 and crosslinked in accordance with Example 6 wherein modulus of a film of the polymer is plotted against increasing temperature.

[a] Obtained with a Perkin Elmer C7 Differential Scanning Calorimeter.
[b] Samples of PAE-1, PAE-2, PAE-3, and PAE-4 powders were compression molded in a 20 mil 4" × 4" cavity mold at 300–400° C. (PAE-1 at 300° C., PAE-2 at 350–375° C., PAE-3 and PAE-4 at 375–400° C.). The dynamic mechanical properties were determined using a Rheometrics RSA-II in the tensile mode. The Tg was obtained from the tan δ. E' is the modulus of the polymers. the modulus, E', of the polymer of Example 6 is illustrated in FIG. 2. E" calculated from E' and tan δ and is called the loss modulus and is also illustrated in FIG. 2. Tan δ is E'/E" and again is illustrated in FIG. 2.

TABLE 4

Tensile Modulus, Thermal Stability, and Moisture Absorption for Examples 2–5.

| | | Thermal Stability[b] | | Moisture Absorption[c] | |
|---|---|---|---|---|---|
| | Tensile | | | wt % Gain via Water | wt % Gain |
| Polymer | Modulus[a] (dynes/cm²) | wt % Loss at 400° C. after | wt % Loss at 450° C. after | Immersion at 23° C. | at 85° F./ 85 RH |
| Example 2 PAE-1 | $1.23 \times 10^{10}$ | 2 hr 0.47 4 hr 0.63 6 hr 0.72 | 2 hr 1.45 4 hr 2.38 6 hr 3.16 | 0.164 | |
| Example 3 | $1.45 \times 10^{10}$ | 2 hr 0.24 | 2 hr 0.48 | 0.332 | 0.279 |

TABLE 4-continued

Tensile Modulus, Thermal Stability, and Moisture Absorption for Examples 2–5.

| Polymer | Tensile Modulus$^a$ (dynes/cm$^2$) | Thermal Stability$^b$ wt % Loss at 400° C. after | wt % Loss at 450° C. after | Moisture Absorption$^c$ wt % Gain via Water Immersion at 23° C. | wt % Gain at 85° F./ 85 RH |
|---|---|---|---|---|---|
| PAE-2 | | 4 hr 0.32 | 4 hr 0.73 | | |
| | | 6 hr 0.36 | 6 hr 0.91 | | |
| Example 4 PAE-3 | 1.32 × 10$^{10}$ | 2 hr 0.31 | 2 hr 0.99 | 0.325 | 0.301 |
| | | 4 hr 0.47 | 4 hr 1.39 | | |
| | | 6 hr 0.57 | 6 hr 1.65 | | |
| Example 5 PAE-4 | 1.39 × 10$^{10}$ | 2 hr 0.42 | 2 hr | 0.82 | 0.275 |
| | | 4 hr 0.58 | 4 hr 1.10 | | |
| | | 6 hr 0.65 | 6 hr 1.26 | | |

$^a$Samples of PAE-1, PAE-2, PAE-3, and PAE-4 powders were compression molded in a 20 mil 4" × 4" cavity mold at 300–400° C. (PAE-1 at 300° C., PAE-2 at 350–375° C., PAE-3 and PAE-4 at 375–400° C.). The dynamic mechanical properties were determined using a Rheometrics RSA-II in the tensile mode.
$^b$Obtained on a Perkin-Elmer TGA7 Thermogravimetric Analyzer with 100 mg test samples and conducted in an atmosphere of nitrogen.
$^c$Water sorption measurements were conducted by drying and weight measurement after equilibration in water at 23° C. as well as at 85% RH at 29° C. in a Hotpack Temperature-Humidity Chamber.

It can be seen in Table 3 that replacement of the hexafluoroisopropylidene linking group (Example 1; U.S. Pat. No. 3,332,909) with a 9,9-bis(4-hydroxyphenyl)fluorene linking group (Examples 2, 3, and 4) that the glass transition temperature (Tg) is elevated by 90°–100° C. In Table 4. it can be seen that this same linking group replacement also enhances the high temperature, thermal stability of these polymers. Both of these characteristics are needed for the successful incorporation of these polymers into microchips. Thus, this invention is an improvement over the compositions taught by U.S. Pat. No. 3,332,909.

The synthesis of these polymers via Ullmann ether synthesis affords non-branched, linear polymers as indicated by the Mw/Mn values (2.66–3.98) listed in Table 2. In order to have good success in gap-fill between metal lines on a silicon wafer, good control over polymer molecular weight and degree of branching is required. As taught in Mercer, F.; Duff, D.; Wojtowicz, J.; Goodman, T; *Polym. Mater. Sci. Eng.* (1992) 66,198–99, the preparation of fluorinated poly (arylene ether)s via condensation of decafluorobiphenyl with bisphenols affords polymers with high degrees of variation in Mw/Mn (3.02 to 39.38) High Mw/Mn values indicate branching in the polymer chain, making them potentially difficult to fill small gaps. Furthermore, the high Mw/Mn values reported for the fluorinated poly(arylene ether)s indicates that the remaining fluorines on the aromatic rings are still susceptible to nucleophilic reaction. The reaction of these fluorines with silica at high temperatures has been reported by Hendricks, N. H.; Wan, B.; Smith, A.; *Proceedings First International Dielectrics for VLSI/ULSI multilevel Interconnection Conference* (DUMIC), 1995, pp 283–89.). There may also be a problem with reaction of these fluorines under the conditions required for metal deposition. Thus, the present invention, with its low Mw/Mn ratios, is an improvement over the compositions taught by Mercer, et al.

Finally, the data provided in Table 4 indicate that low moisture absorption is observed for the polymers of this invention. Typically, polyimides have moisture absorptions a magnitude greater, generally 1.5–3.0 wt % moisture absorption. Thus, this invention is an improvement over polyimide compositions.

EXAMPLE 6 THERMAL CROSSLINKING OF POLY(ARYLENE ETHER)S

A 10 wt % solution of the polymer of Example 3 (PAE-2) which was dissolved in tetrahydrofuran was placed in the cavity of a 11 cm ID glass ring which was laid on a glass plate. After solvent evaporation, a 35 microns thick, circular film was formed which was easily lifted from the glass plate by placing in warm water (<50° C.). Residual solvent in the free standing film was then removed by placing the film on a glass plate contained in a vacuum oven (1.0 mm Hg) and heating the film first at 100° C. for 17 hr., then 200° C. for 24 hr., followed by 280° C. for 24 hrs. After cooling, the film was easily removed from the glass plate and found to have <0.1 wt % residual solvent as determined by thermal gravimetric analysis (TGA).

The polymer film was laid on a Pyrex glass plate contained in a muffle furnace. Under a nitrogen atmosphere, the film was heated from room temperature to 350° C. over a period of 15 min. The film was maintained at 350° C. for 1 hr. then cooled. Removal of the film from the Pyrex glass plate required placing the film/glass in boiling water for 4 hr. After which time, the film was coated with very thin sheets of glass which had come from the glass plate.

The thermal treatment of the polymer in this fashion resulted in some flow of the polymer and adhesion of the polymer to the glass. The adhesive strength of the polymer to the glass was greater than the cohesive strength of the glass. This thermal treatment of the polymer film also created crosslinking within the polymer structure as evident by the lack of solubility of the film in tetrahydrofuran and a substantial tensile modulus, E', of the film at temperatures above the polymer glass transition temperature (Tg), as illustrated in FIG. 2. In FIG. 2, from 25° to 270° C. (below the 272° C. Tg of the polymer), the tensile modulus, E', was 2.0×10$^{10}$ dynes/cm$^2$. From 350° to 450° C. (above the 272° C. Tg of the polymer), the tensile modulus, E', was 2.7×10$^7$ dynes/cm$^2$ as shown in FIG. 2. E", which can be calculated from E' and tanδ, is the loss modulus of the polymer and is illustrated in FIG. 2. Tan δ, which is the ratio of E'/E", is useful for determining the glass transition temperature (Tg), which as illustrated in FIG. 2 occurs at 291° C.

EXAMPLE 7 APPLICATION OF POLY (ARYLENE ETHER)S to Silicon Wafers via Spin-Coating A 6 inch silicon wafer was centered on the spinning chuck of a Solitec spin coater and held in place via backside vacuum. After closing the chamber, the atmosphere was saturated with cyclohexanone. Approximately 1.0 mL of a 10 wt % polymer solution prepared from the polymer of Example 3 (PAE-2) and dissolved in cyclohexanone was placed at the center of the wafer. The wafer was rotated at 500 rpm for 5–15 sec. During this period, a slow, steady stream of the 10 wt % polymer solution was added to the center of the wafer (requiring a total of ca. 5 mL of polymer solution). The rate of wafer rotation was then increased to 2500–3500 rpm. This rate was maintained for a period of 15–40 sec. After which time, the wafer was removed from the spinner and dried in air on a hot plate set at 80°–120° C. The wafer was then placed in a vacuum oven (<1.0 mm Hg) set at 250°–310° C. in order to remove the last traces of solvent.

This procedure afforded a uniform coating of the polymer on the wafer with a thickness of 1–5 microns. The coating was then thermally crosslinked by placing the wafer in a 400°–450° C. oven for 1 hr. with a nitrogen atmosphere (<1% oxygen).

Polymers of Example 3 (PAE-2) and Example 5 (PAE-4) were individually spun onto separate silicon wafers as described above and dried at 120° C. for 2 min. The silicon wafer coated with PAE-2 had a film thickness of 2400 A and the wafer coated with PAE-4 had a film thickness of 5000 A. The dielectric constant ($\epsilon$) for the PAE-2 film was then measured with a Material Development Corp. Model CSM/2 semiconductor measuring system (current/voltage meter with a mercury drop electrode). The PAE-2 polymer film had a dielectric constant of $\epsilon$=2.28 at 1 MHz. Both polymer coated wafers were then thermally cured at 450° C. for one and one half hours in a quartz tube furnace. The dielectric constants for both polymer films were then measured. The PAE-2 polymer film had a dielectric constant of $\epsilon$=2.41 at 1 MHz. and the PAE-4 polymer film had a dielectric constant of $\epsilon$=2.42 at 1 MHz.

The poly(arylene ethers) of the present invention provide unexpected properties as a material and particularly a polymer useful as a replacement for silica-based dielectric material by providing a novel composition of a poly(arylene ether) which does not have: (i) fluorinated substituents which may be reactive especially with metal conductor material or (ii) significantly polarizable functional groups, while providing a low dielectric constant, high thermal stability, ability to self-crosslink and low hydrophilicity under high relative humidity conditions. The poly(arylene ethers) of the present invention are also easily synthesized.

The present invention has been set forth with regard to several preferred embodiments, however the full scope of the present invention should be ascertained from the claims which follow.

We claim:

1. A poly(arylene ether) consisting essentially of non-functional repeating units of the structure:

wherein m=0.2 to 1.0; and n=1.0–m; and $Ar_1$, $Ar_2$ and $Ar_3$ are individually divalent arylene radicals selected from the group consisting of;

and

2. A poly(arylene ether) according to claim 1 having repeating units of the structure:

wherein m=0 to 1.0; and n=1.0–m; and $Ar_1$ and $Ar_2$ are individually divalent arylene radicals selected from the group consisting of;

and

3. A poly(arylene ether) according to claim 1 wherein m=0.5–1.0.

4. A poly(arylene ether) according to claim 1 wherein m=1 and $Ar_1$ is biphenyl.

5. A poly(arylene ether) according to claim 1 wherein m=1 and $Ar_1$ is terphenyl.

6. A poly(arylene ether) according to claim 1 which is crosslinked.

7. A poly(arylene ether) according to claim 6 which is self crosslinked.

8. A poly(arylene ether) according to claim 6 which is crosslinked with an added crosslinking agent.

9. A poly(arylene ether) according to claim 1 which is end capped with an end capping agent.

10. A method of synthesizing a poly(arylene ether) consisting essentially of non-functional repeating units of the structure:

wherein m=0.2 to 1.0; and n=1.0–m; and $Ar_1$, $Ar_2$ and $Ar_3$ are individually divalent arylene radicals selected from the group consisting of;

-continued and and comprising contacting the alkali metal salt of 9,9-bis(4-hydroxyphenyl)-fluorene and zero or more alkali metal salts of dihydric derivative of $Ar_2$ with one or more dihalogenated derivatives of $Ar_1$ and/or $Ar_3$ in the presence of a cuprous catalyst in the presence of a solvent at an elevated temperature in the range of 100° C. to 300° C. and recovering the resulting poly(arylene ether) product.

11. The method of claim 10 wherein the 9,9-bis(4-hydroxyphenyl)fluorene is present in approximately a stoichiometric amount in relation to the dihalogenated derivatives of $Ar_1$ and/or $Ar_3$.

12. The method of claim 10 wherein the alkali metal salt of 9,9-(4-hydroxyphenyl)fluorene is synthesized by reacting 9,9-bis(4-hydroxyphenyl)fluorene in an appropriate solvent with an alkali metal hydroxide with removal of the formed water by azeotropic distillation of the water and the solvent.

13. The method of claim 10 wherein the poly(arylene ether) product is recovered by cooling and precipitation from the solvent.

14. A multilayer electronic circuit article comprising (i) a silicon, glass or ceramic substrate, (ii) a plurality of layers or regions of an insulating material on a surface of the substrate, and (iii) at least one layer or region of a conductive material selected from the group consisting of metals and semiconductive materials, interposed between adjacent layers of the insulating material or within a layer of the insulating material, the insulating material comprising a poly(arylene ether) consisting essentially of non-functional repeating units of the structure:

wherein m=0.2 to 1.0; and n=1.0–m; and $Ar_1$, $Ar_2$ and $Ar_3$ are individually divalent arylene radicals selected from the group consisting of;

15. An article according to claim 14 wherein m=0.5–1.0.

16. An article according to claim 14 wherein m=1 and $Ar_1$ is biphenyl.

17. An article according to claim 14 wherein m=1 and $Ar_1$ is terphenyl.

18. A multichip module comprising a substrate, a plurality of semiconductor chips carried on the substrate and a multilayer interconnect which electronically connects the semiconductor chips and comprises plural layers or regions of conductive material and plural layers or regions of a dielectric material, wherein the dielectric material comprises a poly(arylene ether) consisting essentially of non-functional repeating units of the structure:

wherein m=0.2 to 1.0; and n=1.0−m; and $Ar_1$, $Ar_2$ and $Ar_3$ are individually divalent arylene radicals selected from the group consisting of;

and

19. A module according to claim 18 wherein m=0.5–1.0.

20. A module according to claim 18 wherein m=1 and $Ar_1$ is biphenyl.

21. A module according to claim 18 wherein m=1 and $Ar_1$ is terphenyl.

* * * * *